US006955543B2

(12) United States Patent
Messina et al.

(10) Patent No.: US 6,955,543 B2
(45) Date of Patent: *Oct. 18, 2005

(54) METHOD AND APPARATUS TO FORM A REWORKABLE SEAL ON AN ELECTRONIC MODULE

(75) Inventors: Gaetano P. Messina, Hopewell Junction, NY (US); Patrick A. Coico, Fishkill, NY (US); Lewis S. Goldmann, Bedford, NY (US); Richard F. Indyk, Wappingers Falls, NY (US); Vladimir Jambrih, Kingston, NY (US); Jeffrey A. Zitz, Poughkeepsie, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 162 days.

(21) Appl. No.: 10/604,695

(22) Filed: Aug. 11, 2003

(65) Prior Publication Data

US 2005/0037640 A1 Feb. 17, 2005

(51) Int. Cl.$^7$ ............................................. H01R 12/00
(52) U.S. Cl. ....................... 439/73; 257/712; 361/704; 439/526
(58) Field of Search ............................ 439/71, 73, 526; 361/704, 715; 257/712, 713, 719

(56) References Cited

U.S. PATENT DOCUMENTS

| | | | |
|---|---|---|---|
| 5,435,733 A | * | 7/1995 | Chernicky et al. ............ 439/68 |
| 5,844,311 A | * | 12/1998 | Watanabe et al. ........... 257/712 |
| 5,990,418 A | * | 11/1999 | Bivona et al. ............. 174/52.4 |
| 6,049,456 A | * | 4/2000 | Messina et al. ............. 361/704 |
| 6,386,890 B1 | | 5/2002 | Bhatt et al. |
| 6,497,582 B1 | | 12/2002 | Hoffmeyer |
| 2003/0090872 A1 | | 5/2003 | Chu et al. |

* cited by examiner

Primary Examiner—Phuong Dinh
(74) Attorney, Agent, or Firm—James J. Cioffi; Cantor Colburn LLP (57) ABSTRACT

A system and method to form a reworkable compression seal between an electronic module and a cap are disclosed. The system and method include an electronic module having a tapered edge configured on at least a portion of the edge defining a perimeter of the electronic module and the cap configured with an opening to receive the electronic module therein. A compression seal is disposed with the cap and is configured to surround one or more chips or other electronic components on the electronic module to form a seal between the electronic module and the cap. A plurality of side loaders are operably coupled to the cap and aligned to receive the tapered edge on the electronic module. Each side loader is configured to engage the tapered edge and provide sufficient compressive force to the compression seal disposed between the electronic module and the cap.

24 Claims, 5 Drawing Sheets

METHOD AND APPARATUS TO FORM A REWORKABLE SEAL ON AN ELECTRONIC MODULE

BACKGROUND OF INVENTION

This disclosure relates generally to multi-chip electronic modules, more particularly those attached by land grid array (LGA) connectors.

Current and future high performance computer systems and server systems rely on both large scale packaging of multiple high density interconnect modules and boards that must be upgraded in service. Solder interconnection technology, traditionally used to interconnect smaller modules, is generally inapplicable to larger modules because of premature solder interconnect failures which violate reliability requirements. Moreover a module interconnected by solder interconnections is not easily replaced in the field. Mechanical attachment utilizing an array of brazed pins on the chip carrier and a mating socket on the board has been used for large multi-chip modules, and is readily field replaceable, but has a limitation on interconnect area density which precludes applicability for most current applications. A mechanically actuated interconnection technology, referred to as Land Grid Array (LGA) connectors has arisen, which provides removable and repluggable attachment capability of modules to boards and has sufficient reliability to meet product requirements. The LGA technology has consequently found widespread use in the electronics industry for large modules.

In most cases it is desirable that the removed module be disassembled such that one or more elements may be reused, thus gaining considerable cost savings. Included in module disassembly is the removal of the sealing cap from the chip carrier, or substrate.

Multi-chip modules are typically sealed with a cap to protect the interior chips, interconnections and other devices from atmospheric contamination and debris. The cap provides some degree of hermeticity, protection against debris and damage due to accidental handling, and may also be coupled to the back of the chips with a thermally conductive material to enhance heat transfer. In a typical package, a cooling apparatus, such as a heat sink or other cooling means is disposed on the cap proximate the module to remove heat created in the module.

In the past, there have been two principal technologies utilized to seal modules, adhesive sealing and compressive sealing. In the first, the cap is sealed to the periphery of the chip bearing surface of the chip carrier with an adhesive material, such as an elastomer film. In the second method, the cap is mechanically clamped at the periphery of the chip carrier by a polymer or metal sealing ring pressing on the top, or chip bearing, surface and a balancing support on the bottom surface.

To achieve full advantage of the upgrade and replacement capability inherent with the LGA technology, the LGA-attached module must be capable of being disassembled following an in-service field upgrade or module replacement. Disassembly of an adhesively sealed module is difficult, time-consuming and expensive; may leave a portion of the adhesive seal affixed to the module; and may cause damage to either or both of the cap or module.

Compressive seals are thus the preferred sealing technology for LGA modules. In the existing compressive seal technology, the carrier bottom surface is required as a clamping surface. However, with an LGA interconnect no structure can extend below the I/O pad surface without mechanically interfering with the printed circuit board (PCB). Moreover, utilization of the bottom surface reduces the area available for the input/output (I/O) pads. A clamping surface has been formulated by grinding a flange into the chip carrier or module, but this results in a significantly larger carrier by about 5–10 mm and incurs significant additional expense.

Thus a method and apparatus is desired to effect a reworkable compression seal which does not enlarge carrier size, avoids the need for grinding a flange into the carrier, and does not impact the bottom surface area available for I/Os nor the PCB physical design.

SUMMARY OF INVENTION

Land grid array (LGA) connectors are used to attach circuit modules to printed circuit boards that present an array of noble metal or semi-noble metal plated contacts to not only effect a reliable connection, but also enable circuit module release and replacement. To realize the full benefit of the module replacement attribute of the LGA technology, the module itself must be repairable.

A system and method to form a reworkable compression seal between an electronic module and a cap assembly securable to a printed circuit board are disclosed. The system includes an electronic module having a chip carrier with a tapered edge configured on at least a portion of the edge defining a perimeter of the electronic module and a cap configured with an opening to receive the electronic module therein. A compression seal is disposed with the cap and is configured to surround a contact array of the electronic module and form a seal between the electronic module and cap. A plurality of side loaders are operably coupled to the cap and aligned to receive the tapered edge on the electronic module; each side loader is configured to engage the tapered edge and provide sufficient compression to the compression seal disposed between the electronic module and the cap. Thus when the module is removed, the module does not require replacement due to an adhesive seal affixed thereto or damage to the module upon removal from the cap having an adhesive seal therebetween.

DETAILED DESCRIPTION

Figure 1:
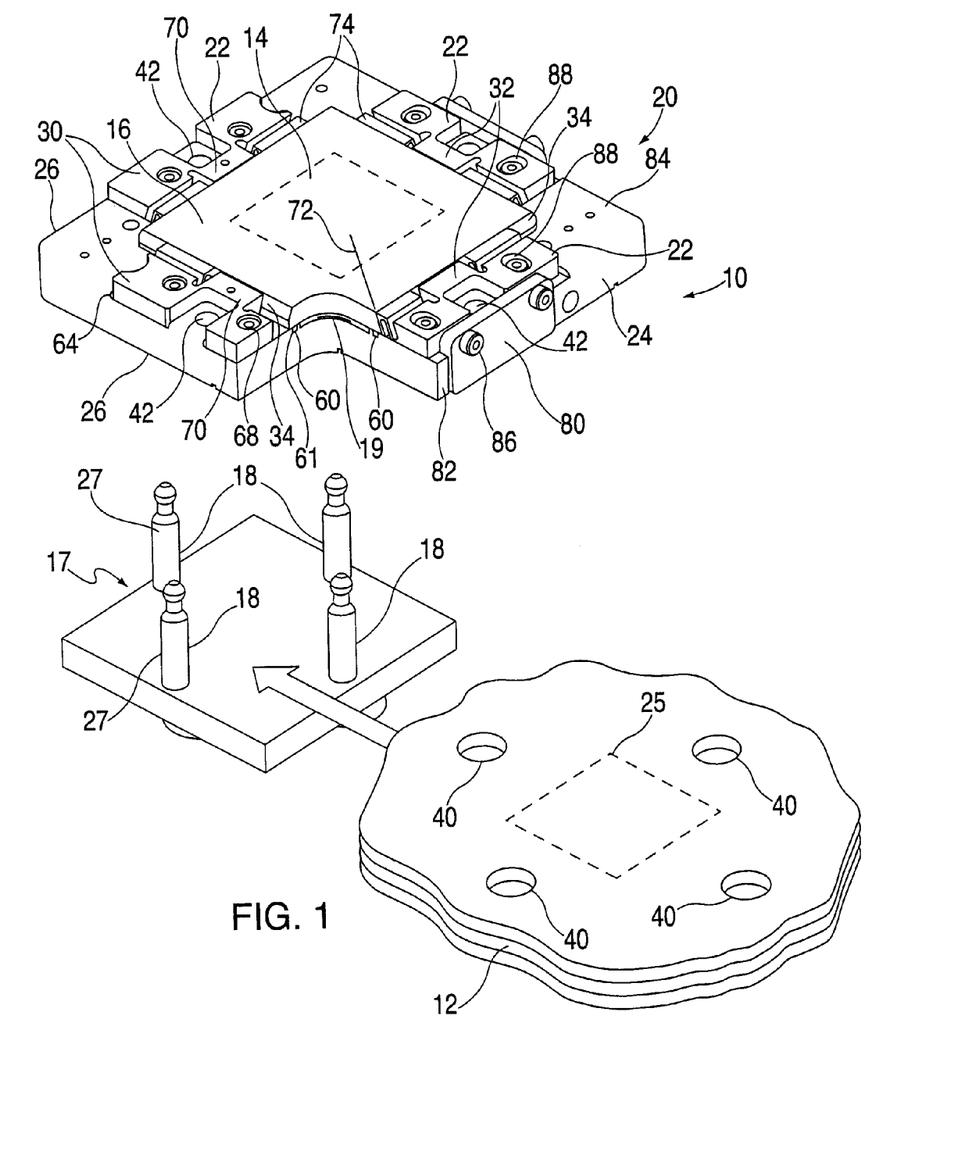
FIG. 1 is a perspective partial exploded view of a circuit module substrate having tapered sides, a cap with side loaders, a land grid array (LGA) connector, and printed circuit board incorporating the present invention.

Referring to the drawings, FIG. 1 is an exploded view of an assembly 10 having an electronic module, or module, 20 and printed circuit board (PCB) 12 which are interconnected by a land grid array (LGA) connector assembly or socket (shown with dashed lines). Circuit module 14 includes a substrate 16 to which multiple chips 19 are affixed thereto. The assembly 10 includes a rigid and planar stiffener 17 with alignment pins 18, and cap assembly 20 having four tapered side loaders or sides 22. As shown, a circuit module 14 is situated between a cap assembly 20 and printed circuit board 12. Cap assembly 20 has a frame portion that includes an opening defined by a cap 24 in which circuit module 14 is received. The opening in cap 24 is bounded on two intersecting sides by walls 26 in which each includes a fixed tapered side loader 30 disposed. Each fixed tapered side loader 30 is abutted by circuit module side walls configured in substrate 16 to align the module with respect to the cap assembly 20. Stiffener 17 and cap 24 ensure that the electrically connecting elements, the land grid array contacts 25 on printed circuit board 12 and the corresponding land grid array contacts on circuit module 14 generally shown at 27 remain coplanar during compressive connection.

Stiffener 17 in FIG. 1 utilizes alignment pins 18 to ensure that the printed circuit board 12 and cap assembly 20 are aligned within tight tolerances required by the high density of contacts within the arrays 25, 27. The contact arrays are typically on 1 mm centers with the number of contacts within an array being from about 750 to about 5000 with the upper end of the range expected to soon be expanded to or greater than 7500. Two alignment pins 27 may have a smaller diameter than the other two to insure that the stiffener 17, cap 24, and printed circuit board 12 maintain a predetermined orientation in the assembled condition. The circuit module 14 is positioned by cap 24 which, in the assembled condition, has adjustable tapered side loaders or sides 32, engaging the module tapered side surfaces 34 in substrate 16 and biasing module 14 against the fixed tapered sides 30 to align the contact arrays of cap 20 and circuit module 14. It should be noted that although tapered side surface 34 is illustrated as a partial taper or just a portion of an edge defining substrate 16 in FIGS. 1–5, that the tapered side surface 34 may extend to define substantially the entire edge of a perimeter defining substrate 16 as in FIGS. 6–8.

When the stiffener 17 is mounted below printed circuit board 12 with the alignment pins 18 extending through board apertures 40 and cap apertures 42, the cap assembly 20 is assembled to PCB 12 by aligning cap apertures 42 over at least one pair of alignment pins 18 and then securing the cap assembly against the PCB 12 by securing a fastener (not shown) on an end of each alignment pin 18 extending through each cap aperture 42. Such fasteners include, but are not limited to, threadable nuts, engagement springs and snap-fit receivers configured to be received on each alignment pin 18.

Surrounding the multiple chips 19 is a continuous strip of gasket material 60 or O-ring, as illustrated in FIG. 1, which is compressed by cap assembly 20 biasing a bottom surface of substrate 16 toward cap 24. In the assembled condition of the cap assembly 20, the gasket 60 is captured between the substrate 16 and the cap 24 and forms a sealed enclosure about the interface of the cap assembly 20 and module 14. Gasket 60 is captured in a channel 61 configured in cap 24 to receive and retain gasket 60 therein.

The gasket 60 may be formed from a variety of materials including butyl, urethane, or silicone rubber materials; filter materials; porous, closed cell foams, including neoprene; or even a very soft malleable metal. It is desirable that the gasket be deformable to create a reworkable, non-adhesive seal and maintains full elasticity in the compressed state.

Compressive force is applied through cap assembly 20 directly onto the module 14 during the mounting process. The cap 24 is preferably composed of a highly thermally conductive material. Since cap assembly 20 is in direct contact with the module 14, it serves as a heat sink and where appropriate may include an extended surface to provide cooling fins or other cooling means coupled therewith.

Figures 2, 6, 7, 8:
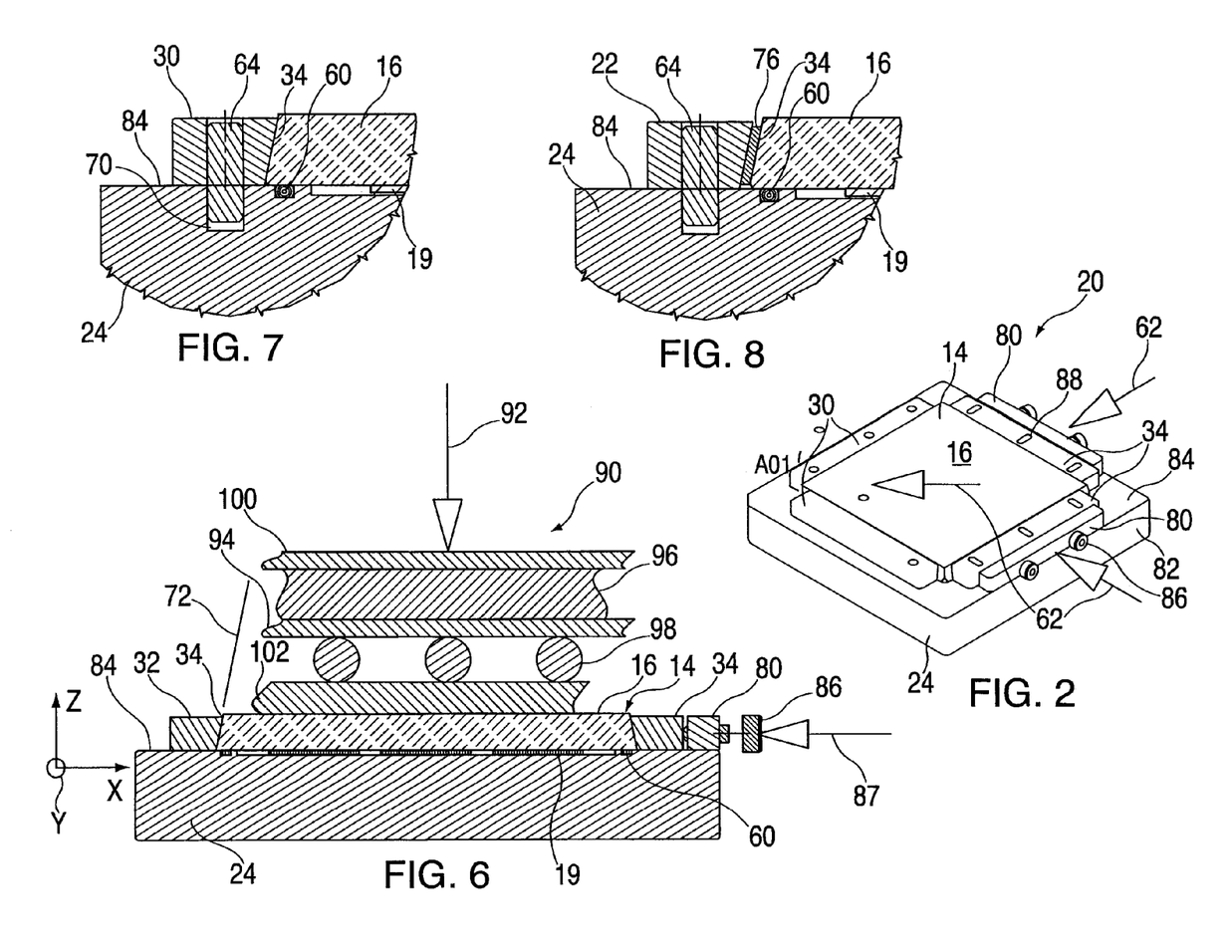
FIG. 2 is a top perspective view illustrating a direction in which the circuit module substrate may be disposably positioned by adjusting adjustable sides of a cap.
FIG. 6 is a cross section view of the circuit module substrate and cap having tapered side loaders as in FIG. 1 being positioned with the X-Y roller means of FIG. 5.
FIG. 7 is a partial cross section view of the circuit module substrate and cap having tapered side loaders as in FIG. 1 illustrating a dowel pin for fixing the tapered side loaders of the cap.
FIG. 8 is a partial cross section view of the circuit module substrate and cap having tapered side loaders as in FIG. 7 illustrating a cushion disposed between a tapered side loader and the substrate.
Figure 5:
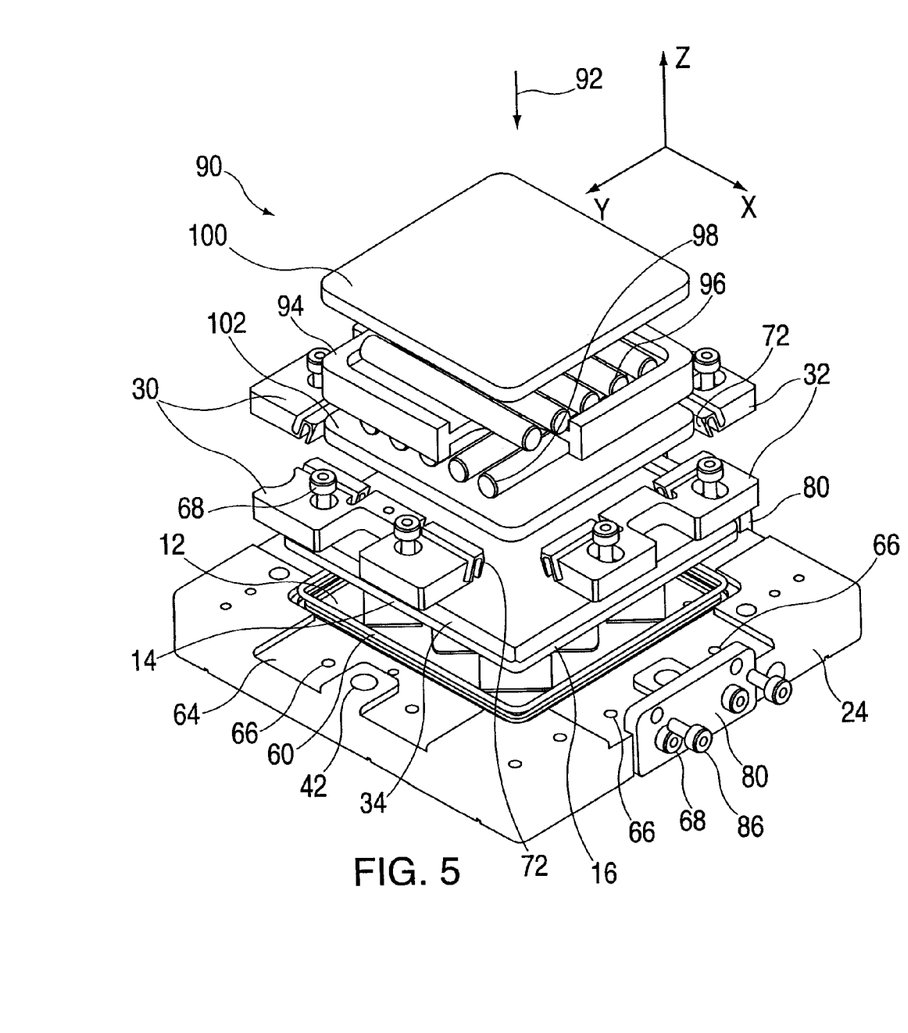
FIG. 5 illustrates an exploded perspective view of the circuit module substrate and cap having side loaders with tapered sides as in FIG. 1, but with the cap in contact with an X-Y roller means.

More specifically, in an exemplary embodiment as illustrated in FIGS. 1 and 2, circuit module 14 is positioned by cap 24 which, in the assembled condition, has adjustable tapered side loaders or sides 32, engaging the module tapered side surfaces 34 in substrate 16 and biasing module 14 against the fixed tapered sides 30 to properly align the contact arrays of cap 24 and circuit module 14 indicated generally with loading arrows 62 in FIG. 2. Fixed tapered sides 30 are each configured as a fixed block configured to be received in a complementary configured cavity 64 configured in cap 24 as best seen in FIG. 5. Each fixed tapered side or block 20 is retained with cavity 64 using a headed mechanical fastener 68 extending through block 30 into a complementary threaded opening 66 configured in cap 24. However, other means are contemplated, including using a dowel as mechanical fastener to be received in a complementary configured opening 66 in cap 24 as illustrated in FIG. 7.

Referring again to FIG. 1, each fixed tapered side 30 includes a center portion 70 facing edges defining a perimeter of circuit module 14. Center portion 70 is preferably tapered substantially having a taper angle 72 substantially equivalent to the tapered side surfaces 34 in substrate 16 as best seen in FIG. 6. Tapered center portion 70 is configured to positively locate circuit module 14 into proper position with respect to PCB 12. In an exemplary embodiment, taper angle 72 is about 20 degrees relative to the side wall defining an outboard edge of substrate 16, but there may be conditions where other angles are optimal. Theoretically, any angle above about zero degrees to nearly 90 degrees is possible, but a practical useful range is between about 5 degrees to about 45 degrees.

Figure 3:
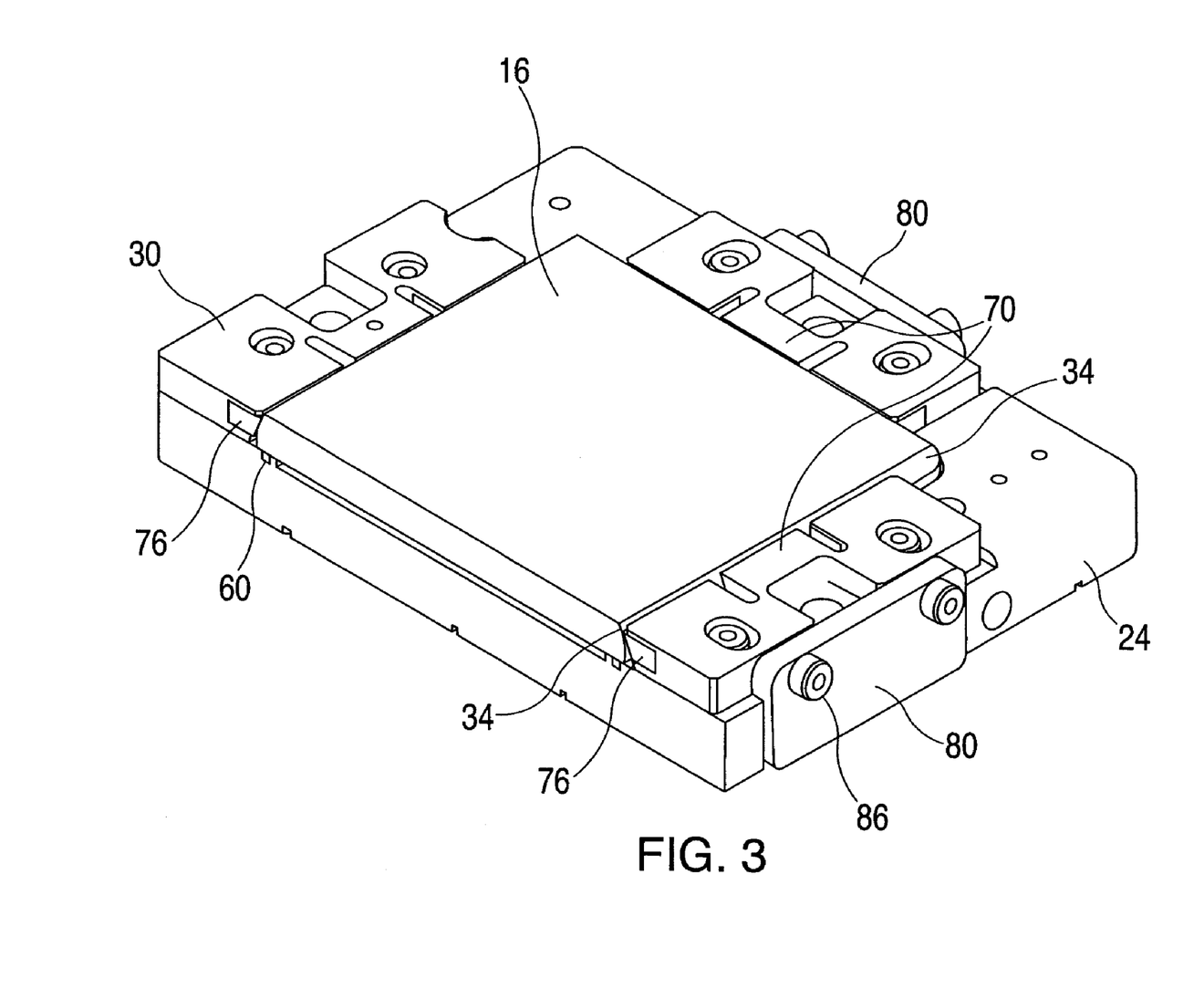
FIG. 3 is a cross section perspective view of an alternative embodiment of the cap of FIG. 1 having side loaders with polymer inserts.

A pair of biasing members 74 are disposed on either side of center portion 70 extending to edges defining a length of each fixed tapered side 30. Each biasing member is configured to accommodate any mismatch in the coefficients of thermal expansion (CTE) between materials of substrate 16 and cap 24. Each biasing member 74 in FIG. 1 is a "S" spring to allow for thermal expansion between substrate 16 and cap 24. However, it will be recognized by one skilled in the pertinent art that other embodiments for biasing members 74 may be employed, including, but not limited to, a cushion or resilient insert 76 disposed between a side loader 22 and substrate 16 as illustrated in FIG. 8. In one embodiment referring to FIG. 8 for example, insert 76 may be polymer insert disposed between a side loader 22 and tapered side surface 34 of substrate 16. In another embodiment, side loaders 22 may be configured to receive insert 76 therein on either side of center portion 70 such that it extends from each side loader 22 outward to make initial contact with tapered side surface 34 of substrate 16 as shown in FIG. 3. However, it is also contemplated that insert 76 may extend a total length of each side loader 22 defining a contact surface with tapered side surface 34. Other methods to exercise constant forces could be employed without changing the design intent, as another embodiment could optionally employ springs, for example.

Referring again to FIG. 1, cap assembly 20 further includes a loader plate 80 secured to cap 24 corresponding and aligned with each adjustable side loader 32. Each loader plate 80 may be secured to a side surface 82 defining a perimeter of cap 24 as in FIG. 1. Alternatively, each loader plate 80 may be secured to a top surface 84 defining cap 24 as illustrated in FIGS. 2 and 6–8. Each loader plate 80 may be secured to cap 24 using mechanical or chemical means, including, but not limited to, mechanical fasteners, chemical bonding, and the like. For example, with reference to FIG. 5, each loader plate 80 (e.g., two shown) is mechanically fastened using headed mechanical fastener 68 extending through plate 80 into a complementary threaded opening (not shown) configured in cap 24.

Still referring to FIG. 1, each loader plate 80 is configured to receive a loader screw 86 threadably therethrough to engage a corresponding adjustable tapered side loader 32 at a side surface opposite its tapered surface to bias the adjustable side loader 32 toward tapered side surface 34 of substrate 16 when loader screw 86 is tightened and moves in a direction indicated by arrow 87 in FIG. 6. As illustrated in the Figures, exemplary embodiments employ two loader screws 86 per each loader plate 80, however, any number is contemplate for loading adjustable side loaders 32 against substrate 16 as indicated with loading arrows 62 in FIG. 2. Other methods to apply horizontal actuation force to the adjustable loader plates 80 could be employed without changing the design intent, for example a cam or a pressure plate. The horizontal force mechanism need not be permanently attached to the final assembly if the mechanical fasteners 68 provide sufficient force to hold the adjustable tapered side loaders 32 in place.

Referring again to FIG. 1, each adjustable side loader 32 is configured with an elongated opening 88 extending therethrough. Each elongated opening 88 is dimensioned to allow a headed mechanical fastener 68 extending through the adjustable side loader 32 into a complementary threaded opening 66 configured in cap 24 as best seen with reference to FIG. 5 while allowing translation of the adjustable side loader 32 to and from the substrate 16. In other words, the headed mechanical fastener 68 extending through the adjustable side loader 32 into a complementary threaded opening 66 is not tightened down or is only partially tightened down to allow such translation. Upon proper positioning of circuit module 14 in cap assembly 20 via tightening loader screws 86 to load the module 16 as shown in FIG. 2, headed mechanical fasteners in the adjustable side loaders may be tightened to secure the resulting socket assembly and then later loosened if desired to reverse the process to remove the circuit module 14.

Referring now to FIGS. 5 and 6, a system and method to load circuit module 14 within cap assembly 20 are illustrated. In one exemplary embodiment, a loader assembly 90 is employed to impart a downward Z axis load on the top surface of substrate 16 as illustrated by arrow 92, while permitting X-Y motion of the circuit module 14. The loader assembly includes a middle portion 94 configured to retain a plurality of rollers 96 aligned in parallel with each other in the X axis direction on a first surface and a plurality of rollers 98 aligned in parallel with each other in the Y axis direction on an opposite surface of the first surface. Rollers 96 are oriented substantially perpendicular to rollers 98. A top plate 100 is arranged on top of rollers 96 while a bottom plate 120 is arranged below rollers 98 having middle portion 94 intermediate top plate 100 and bottom plate 102. While the loader applies a Z force 92 to the substrate 16 through the bottom plate 102, substrate 16 is able to move in an X-Y direction under the horizontal forces exerted by adjustable side loaders 34. Such loading assemblies 90 are well known in the art and can enable module 14 to translate in the desired loading directions indicated with loading arrows 62 in FIG. 2 while being held down by Z force 92. The loader 90 adds Z force to compress the gasket 60 in position to augment the Z component exerted by the side loaders 20.

Figure 4:
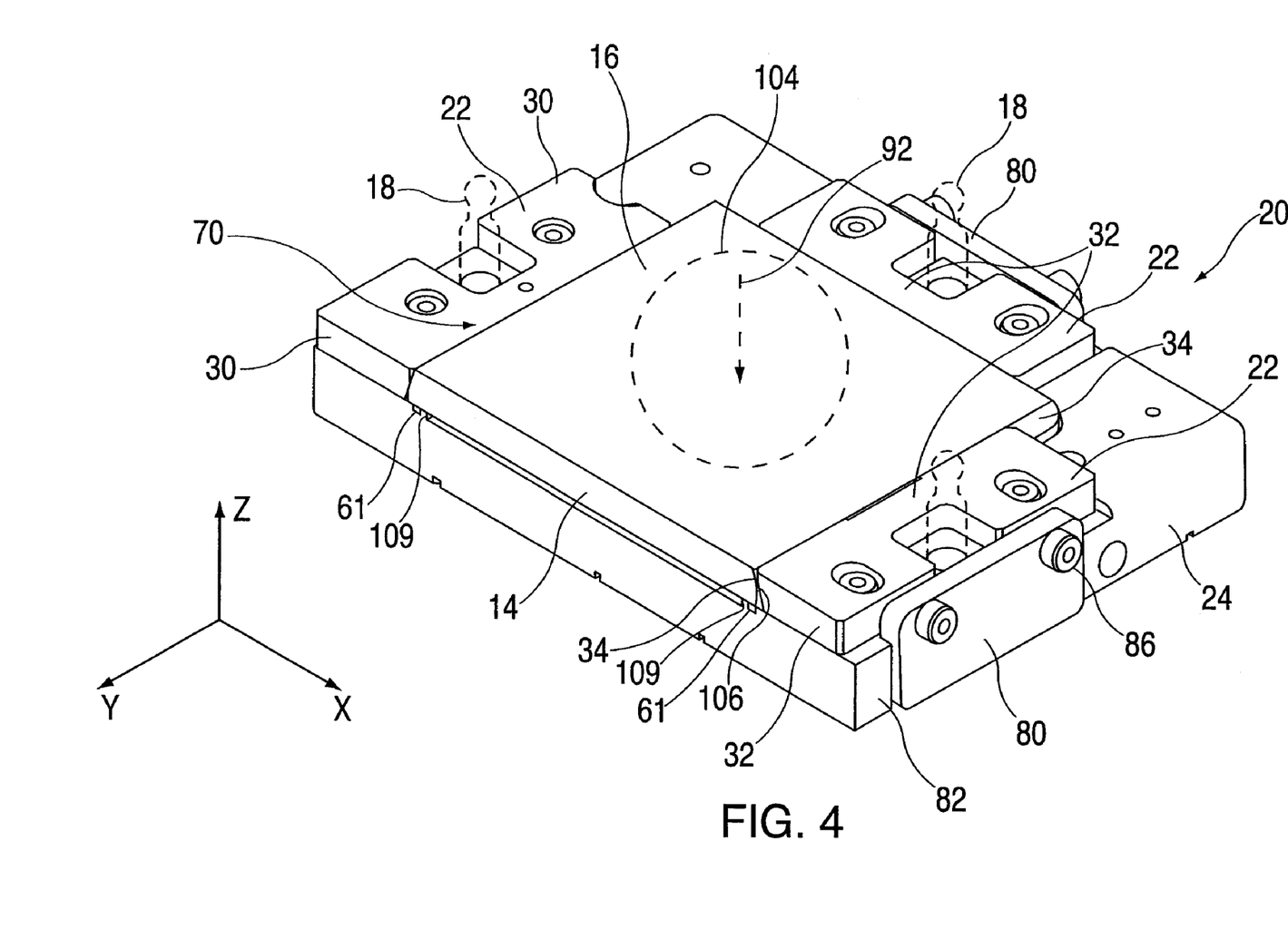
FIG. 4 is a cross section perspective view of another alternative embodiment of the cap of FIG. 1 defined by solid side loaders with tapered sides.

Referring now to FIG. 4, an alternative system and method to load circuit module 14 within cap assembly 20 are illustrated. A ball loading assembly shown in phantom at 104 may be employed to impart a downward Z axis load as illustrated by arrow 92 in phantom, while permitting X-Y motion of the circuit module 14. As in the loading assembly 90 discussed above, the ball assembly 104 may be employed to aid the tightening of substrate 16 into proper position with respect to cap assembly 20.

FIG. 4 also illustrates another alternative embodiment for the four side loaders 22 (only three shown, one fixed side loader 30 and two adjustable side loaders 32). Each side loader 22 illustrates center portion 70 extending to outboard ends defining each side loader 22 without any biasing members 74. More specifically, each side loader 22 is configured as a solid block of material further defined having a corresponding tapered edge 106 in direct communication with tapered side surface 34 of substrate 16 along the length defining each side loader 22. It is also contemplated that such a side loader 22 illustrated in FIG. 4 may also be further configured to receive the insert 76 of FIG. 3, such that insert 76 includes a taper 107 corresponding to the taper on tapered side surface 34 and the insert extends partially, intermittently or entirely along the length defining each side loader 22.

It will be noted that FIG. 4 is a cross section view of cap assembly 20 illustrating a shoulder 109 inside a perimeter defined by channel 61 configured in cap 24. Shoulder 109 is configured to allow a perimeter bottom portion of substrate 16 to rest outside shoulder 109 while chips 19 are disposed in the opening configured in cap 24. It will be recognized a depth created by both shoulder 109 and channel 61 are illustrated as being substantially the same, however, any suitable depth for each is contemplated for their respective intended purpose.

In summary, the above described system and method provide use of reworkable, non-adhesive seals (e.g., O-ring compression seals) that require mechanical compression to achieve a consistent seal. The system and method include replacing the common square-ground edge on the ceramic chip carrier with a taper-ground edge. The cap is then configured with a mechanism that engages the tapered edges on the four edges of the carrier thus providing sufficient compression force to the O-ring compression seal (or other compressive seal means). By engagement along the tapered edges of the carrier, carrier size is kept to a minimum and the need for grinding a flange into the carrier is eliminated while not impacting a bottom surface mounted I/O pad count or the PCB physical design.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method to form a reworkable compression seal between an electronic module and a cap, the method comprising:
   configuring a tapered edge on at least a portion of the edge defining a perimeter of the electronic module;
   configuring the cap with an opening to receive the electronic module therein;
   disposing a compression seal with the cap, said seal configured to form a seal between the electronic module and the cap;
   coupling a plurality of side loaders to said cap and aligned to receive said tapered edge on the electronic module, each side loader of said plurality of side loaders configured to engage said tapered edge and provide sufficient compression to said compression seal disposed between said electronic module and the cap.

2. The method as recited in claim 1, further comprising:
   configuring at least one of the side loaders to be a fixed side loader with respect to said cap, said fixed side loader is configured to abut two contiguous side walls defining the electronic module, the side walls having the tapered edge are configured in the electronic module to align the module with respect to said cap, said fixed side loader having a corresponding tapered surface edge in communication with the tapered edge of the electronic module;
   configuring two of the side loaders to be adjustable side loaders with respect to said cap, said adjustable side loaders having a corresponding tapered surface edge in communication with the tapered edge of the electronic module, said adjustable side loaders configured to be adjusted with respect to said fixed side loader to vary an amount of compression force exerted on said compression seal from the electronic module.

3. The method as recited in claim 1, further comprising:
   configuring all of the side loaders to be adjustable side loaders with respect to said cap, said adjustable side loaders having a corresponding tapered surface edge in communication with the tapered edge of the electronic module, said adjustable side loaders configured to be adjusted with respect to said cap to vary an amount of compression force exerted on said compression seal from the electronic module.

4. The method as recited in claim 2, wherein when said two adjustable side loaders are moved toward said fixed side loader, the compression force on said compression seal is increased due to said tapered surface edges on said side loaders acting on said tapered edge of the electronic module.

5. The method as recited in claim 2, wherein said fixed side loader includes two fixed side loaders abutting said two contiguous side walls defining the electronic module, said side walls having said tapered edge configured in the electronic module to align the module with respect to said cap.

6. The method as recited in claim 1, wherein each of said side loaders includes a biasing member extending from at least a portion of said tapered surface edge of said each side loader operably in contact with said tapered surface of the electronic module.

7. The method as recited in claim 6, wherein said biasing member includes at least one of, including combinations of at least one of:
   a compression spring;
   a "S" spring;
   a cushion; and
   a resilient insert disposed between said tapered edge of the electronic module and the tapered surface edge of said side loaders.

8. The method as recited in claim 6, wherein said biasing member is disposed on either side of a center portion in contact with said tapered edge of the module, each biasing member extending to outboard ends defining a length of each side loader, said biasing member configured to allow for different coefficient of thermal expansion between materials of the electronic module and said cap.

9. The method as recited in claim 8, wherein said center portion is configured to positively locate the electronic module into a proper position.

10. The method as recited in claim 1, wherein at least one of said side loaders is fixed with respect to said cap using one of headed mechanical fasteners and dowels extending therethrough into said cap.

11. The method as recited in claim 2, wherein said two adjustable side loaders are translatable with respect to said cap using one of headed mechanical fasteners and dowels extending through elongated openings configured therein and fixed into said cap.

12. The method as recited in claim 1, further comprising:
    configuring a channel in the cap to receive said compression seal.

13. A system to form a reworkable compression seal between an electronic module and a cap comprising:
    an electronic module having a tapered edge configured on at least a portion of the edge defining a perimeter of the electronic module;
    a cap configured with an opening to receive the electronic module therein;
    a compression seal disposed with the cap, said seal configured to form a seal between the electronic module and the cap;
    a plurality of side loaders operably coupled to said cap and aligned to receive said tapered edge on the electronic module, each side loader of said plurality of side loaders configured to engage said tapered edge and provide sufficient compression to said compression seal disposed between said electronic module and the cap.

14. The system as recited in claim 13, wherein at least one of said side loaders is a fixed side loader, fixed with respect to the cap, said fixed side loader is configured to abut two contiguous side walls defining said electronic module, the side walls having the tapered edge are configured in said electronic module to align said electronic module with respect to said cap, said fixed side loader having a corresponding tapered surface edge in communication with the tapered edge of said electronic module, two of said plurality of side loaders are configured to be adjustable side loaders with respect to said cap, said adjustable side loaders having a corresponding tapered surface edge in communication with said tapered edge of said electronic module, said adjustable side loaders configured to be adjusted with respect to said fixed side loader to vary an amount of compression force exerted on said compression seal from said electronic module.

15. The system as recited in claim 13, wherein all of the side loaders are configured to be adjustable side loaders with respect to said cap, said adjustable side loaders having a corresponding tapered surface edge in communication with the tapered edge of the electronic module, said adjustable side loaders configured to be adjusted with respect to said cap to vary an amount of compression force exerted on said compression seal from the electronic module.

16. The system as recited in claim 14, wherein when said two adjustable side loaders are moved toward said fixed side loader, the compression force on said compression seal is increased due to said tapered surface edges on said side loaders acting on said tapered edge of said electronic module.

17. The system as recited in claim 14, wherein said fixed side loader includes two fixed side loaders abutting said two contiguous side walls defining said electronic module, said side walls having said tapered edge configured in said electronic module to align said electronic module with respect to the cap.

18. The system as recited in claim 13, wherein each of said side loaders includes a biasing member extending from at least a portion of said tapered surface edge of said each side loader operably in contact with said tapered surface of said electronic module.

19. The system as recited in claim 18, wherein said biasing member includes at least one of, including combinations of at least one of:
   a compression spring;
   a "S" spring;
   a cushion; and
   a resilient insert disposed between said tapered edge of said electronic module and said tapered surface edge of said side loaders.

20. The system as recited in claim 18, wherein said biasing member is disposed on either side of a center portion in contact with said tapered edge of said electronic module, each biasing member extending to outboard ends defining a length of each said side loader, said biasing member configured to allow for different coefficient of thermal expansion between materials of said electronic module and said cap.

21. The system as recited in claim 20, wherein said center portion is configured to positively locate said electronic module into a proper position.

22. The system as recited in claim 13, wherein at least one of said side loaders is fixed with respect to said cap using one of headed mechanical fasteners and dowels extending therethrough into said cap.

23. The system as recited in claim 14, wherein said two adjustable side loaders are translatable with respect to said cap using one of headed mechanical fasteners and dowels extending through elongated openings configured therein and fixed into said cap.

24. The system as recited in claim 13, further comprising:
   a channel configured in the cap to receive said compression seal.

* * * * *